US012374406B2

(12) United States Patent
Choi

(10) Patent No.: US 12,374,406 B2
(45) Date of Patent: Jul. 29, 2025

(54) PAGE BUFFER CIRCUIT, METHOD OF OPERATING A SEMICONDUCTOR MEMORY DEVICE AND SEMICONDUCTOR MEMORY SYSTEM

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 334 days.

(21) Appl. No.: 18/073,340

(22) Filed: Dec. 1, 2022

(65) Prior Publication Data

US 2023/0402104 A1  Dec. 14, 2023

(30) Foreign Application Priority Data

May 23, 2022 (KR) .................. 10-2022-0062986

(51) Int. Cl.
*G11C 16/24* (2006.01)

(52) U.S. Cl.
CPC .................. *G11C 16/24* (2013.01)

(58) Field of Classification Search
CPC . G11C 11/4093; G11C 11/56; G11C 2211/56; G11C 2211/5642; G11C 7/1051; G11C 7/106; G11C 7/1078; G11C 7/1087
See application file for complete search history.

(56) References Cited

U.S. PATENT DOCUMENTS

| 8,982,618 B2 * | 3/2015 | Joo | ............ G11C 16/10 365/189.05 |
| 10,325,658 B2 * | 6/2019 | Lee | ............ G11C 16/10 |
| 11,972,816 B2 * | 4/2024 | Choi | ............ G11C 16/0483 |
| 12,087,366 B2 * | 9/2024 | Deng | ............ G11C 11/5671 |
| 2023/0154546 A1 * | 5/2023 | Choi | ............ G11C 16/10 365/185.21 |

FOREIGN PATENT DOCUMENTS

| KR | 1020170069010 A | 6/2017 |
| KR | 101916161 B1 | 11/2018 |
| KR | 1020200139496 A | 12/2020 |

* cited by examiner

*Primary Examiner* — Jerome Leboeuf
*Assistant Examiner* — Christopher Lane Reece
(74) *Attorney, Agent, or Firm* — WILLIAM PARK & ASSOCIATES LTD.

(57) ABSTRACT

A page buffer circuit including a data latch circuit and a sensing latch circuit. The data latch circuit configured to store data corresponding to a normal operation. The sensing latch circuit configured to receive and store the data in the data latch circuit in an entering operation in accordance with a suspend operation. The sensing latch circuit configured to transmit the data stored in the sensing latch circuit to the data latch circuit in a sensing operation in accordance with the suspend operation. The sensing latch circuit configured to suspend data in a memory cell, and to output the suspend data from the memory cell.

17 Claims, 5 Drawing Sheets

PAGE BUFFER CIRCUIT, METHOD OF OPERATING A SEMICONDUCTOR MEMORY DEVICE AND SEMICONDUCTOR MEMORY SYSTEM

CROSS-REFERENCES TO RELATED APPLICATION

The present application claims priority under 35 U.S.C. § 119(a) to Korean application number 10-2022-0062986, filed on May 23, 2022, in the Korean Intellectual Property Office, which is incorporated herein by reference in its entirety.

BACKGROUND

1. Technical Field

Various embodiments generally relate to a page buffer circuit, a method of operating a semiconductor memory device and a semiconductor memory system, more particularly, to a page buffer circuit configured to suspend an operation during a normal operation and resume the operation after the normal operation, a method of operating a semiconductor memory device and a semiconductor memory system.

2. Related Art

Generally, a semiconductor memory device may be classified into a volatile memory device and non-volatile memory device. The volatile memory device and the non-volatile memory device may receive power to store data and output the stored data. The volatile memory device may have a rapid data-processing speed. In contrast, in order to maintain the stored data, the volatile memory device may continuously receive the power. The non-volatile memory device might not continuously receive the power for maintaining the stored data. In contrast, the non-volatile memory device may have a data-processing speed slower than the data-processing speed of the volatile memory device.

As processes and design technologies of the semiconductor memory device have been developed, a difference between the data-processing speeds of the volatile memory device and the non-volatile memory device have been greatly decreased. Thus, an interest may be focused on the non-volatile memory device free of the power in view of the maintenance of the stored data.

The non-volatile memory device may include a NAND type flash memory device having a string structure where a plurality of memory cells may be serially connected with each other. The memory cell of the NAND type flash memory device may include a floating gate. The memory cell may charge or discharge an electron in/from the floating gate through Fowler-Nordheim tunneling to store a logic 'high' data or a logic 'low' data.

The non-volatile memory device including the NAND type flash memory device may perform a program operation to store the data in the memory cell and a read operation to output the data stored in the memory cell. The non-volatile memory device may perform an erase operation to erase the data stored in the memory cell before the program operation.

The semiconductor memory device may aid a suspend operation. The suspend operation may output the data stored in the memory cell in accordance with a request of a host device or a control device during a normal operation such as the program operation, the read operation, etc. The semiconductor memory device may stop the progressed normal operation in the suspend operation to perform a sensing operation and the output operation in accordance with the data desired by the host device or the control device. The semiconductor memory device may resume the normal operation stopped after the output operation by the suspend operation. That is, the semiconductor memory device may perform the normal operation in response to the resume operation after the suspend operation.

SUMMARY

According to various embodiments, there may be provided a page buffer circuit. The page buffer circuit may include a data latch circuit and a sensing latch circuit. The data latch circuit may be configured to store data corresponding to a normal operation. The sensing latch circuit may receive and store the data in the data latch circuit in an entering operation in accordance with a suspend operation. The sensing latch circuit may transmit the data stored in the sensing latch circuit to the data latch circuit in a sensing operation in accordance with the suspend operation. The sensing latch circuit may sense suspend data in a memory cell, and output the suspend data from the memory cell.

According to various embodiments, there may be provided a method of operating a semiconductor memory device. In the method of operating the semiconductor memory device, the semiconductor memory device may perform a normal operation. The semiconductor memory device may include a static type sensing latch circuit and a dynamic type data latch circuit. The semiconductor memory device may enter into a suspend operation based on a command signal corresponding to the suspend operation. Data may be transmitted between the data latch circuit and the sensing latch circuit. Suspended data may be sensed and output through the sensing latch circuit. The normal operation may then be resumed.

According to various embodiments, there may be provided a semiconductor memory system. The semiconductor memory system may include a semiconductor memory device and a host device. The semiconductor memory device may include a data latch circuit and a sensing latch circuit. The data latch circuit may be configured to store data corresponding to a normal operation. The sensing latch circuit may be configured to perform a sensing operation. The host device may control transmissions of the data between the data latch circuit and the sensing latch circuit in a suspend operation.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of disclosure as defined in the appended claims.

The embodiments described herein with reference to cross-section and/or plan illustrations are examples of embodiments. Thus, these embodiments should not be construed as limiting the concepts. Although a few embodiments will be shown and described, it will be appreciated by those of ordinary skill in the art that changes may be made in these embodiments without departing from the principles and spirit of the present disclosure.

Figure 1:
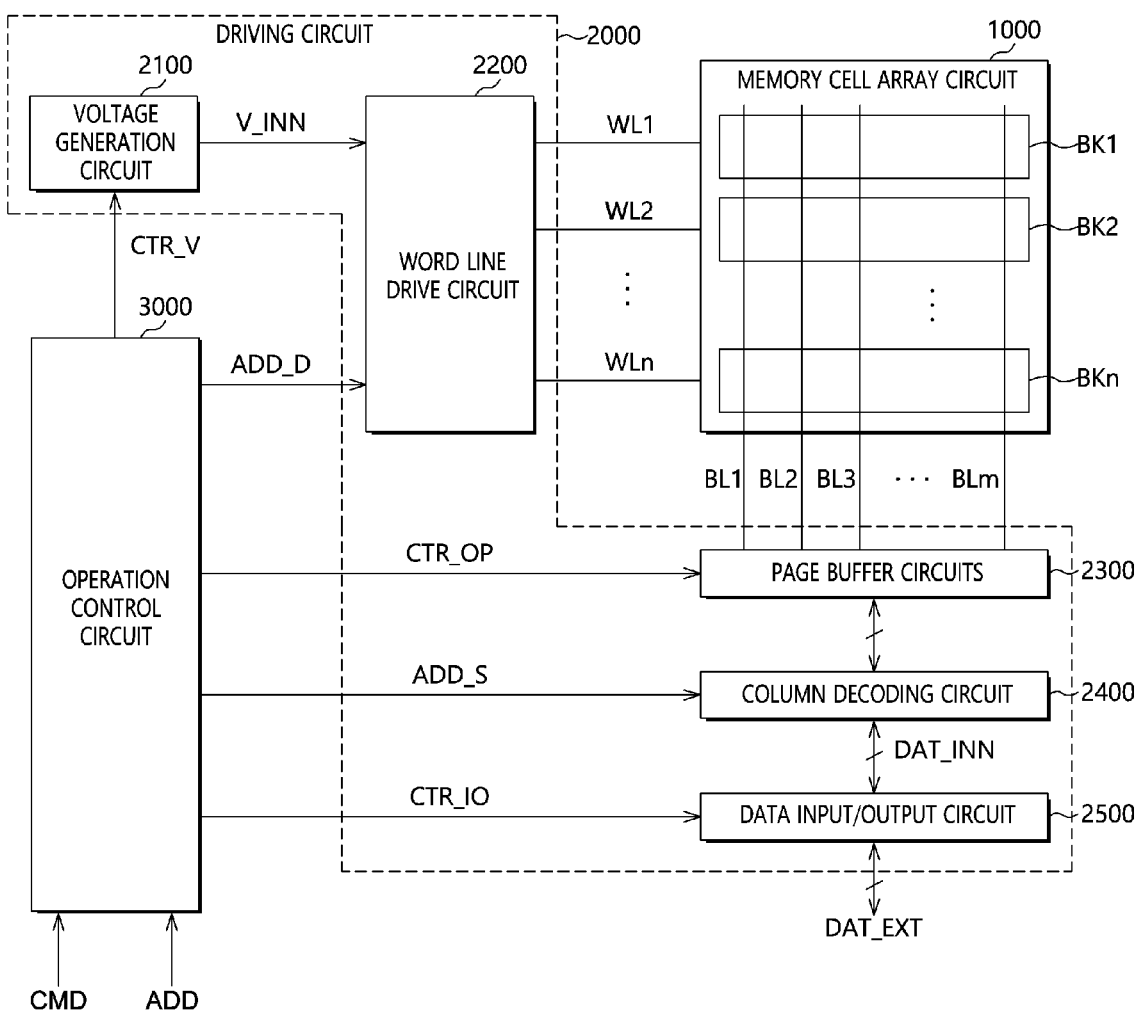
FIG. 1 is a block diagram illustrating a semiconductor memory device in accordance with various examples of embodiments.

FIG. 1 is a block diagram illustrating a semiconductor memory device in accordance with various examples of embodiments.

Referring to FIG. 1, a semiconductor memory device may include a memory cell array circuit 1000, a driving circuit 2000 and an operation control circuit 3000.

The memory cell array circuit 1000 may be configured to store data. The memory cell array circuit 1000 may include a plurality of memory block circuits BK1~BKn (n is a natural number). Each of the memory block circuits BK1~BKn may include a plurality of memory cells configured to store the data. Each of the memory cells may have a string structure serially connected with each other in a vertical direction in drawings. Each of the memory cells may have a matrix shape including a plurality of word lines WL1~WLn and a plurality of bit lines BL1~BLm (m is a natural number) intersected with each other. The word lines WL1~WLn may be driven by a predetermined voltage in accordance with a program operation, a read operation and an erase operation by a word line driving circuit 2200. The bit lines BL1~BLm may be driven by a predetermined voltage in accordance with data stored or to be stored in the memory cell. The word "predetermined" as used herein with respect to a parameter, such as a predetermined voltage or time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The driving circuit 2000 may be driven to perform the program operation, the read operation and the erase operation with respect to the memory cell array circuit 1000. The driving circuit 2000 may include a voltage generation circuit 2100, a word line driving circuit 2200, a plurality of page buffer circuits 2300, a column decoding circuit 2400 and a data input/output circuit 2500.

The voltage generation circuit 2100 may be configured to generate an internal voltage V_INN for the program operation, the read operation and the erase operation. The voltage generation circuit 2100 may generate the internal voltage V_INN having various voltage levels corresponding to the operations based on a voltage control signal CTR_V generated from the operation control circuit 3000.

The word line driving circuit 2200 may be configured to selectively drive the word lines WL1~WLn using the internal voltage V_INN generated from the voltage generation circuit 2100. As used herein, the tilde "~" indicates a range of components. For example, "WL1~WLn" indicates the word lines WL1, WL2, . . . , and WLn shown in FIG. 1. The word line driving circuit 2200 may receive the internal voltage V_INN from the voltage generation circuit 2100. The word line driving circuit 2200 may receive a drive address signal ADD_D from the operation control circuit 3000. The drive address signal ADD_D may selectively activate a corresponding word line among the word lines WL1~WLn. Thus, the word line driving circuit 2200 may selectively activate the word lines WL1~WLn based on the drive address signal ADD_D and the internal voltage V_INN. The word line driving circuit 2200 may drive the activated word line using the internal voltage V_INN.

Although not depicted in drawings, the word line driving circuit 2200 may be connected to a drain selection line, a source selection line and a common source line in the memory cell array circuit 1000. Thus, the word line driving circuit 2200 may drive each of the drain selection line, the source selection line and the common source line using the internal voltage V_INN in accordance with the program operation, the read operation and the erase operation.

As mentioned above, each of the memory cells may be connected to each of the word lines WL1~WLn. Thus, a word line connected to a selected memory cell in the program operation, the read operation and the erase operation. Hereinafter, for conveniences of explanations, the memory cell selected in the program operation, the read operation and the erase operation may be referred to as a selected memory cell and the word line connected to the selected memory cell may be referred to as a selected word line. Further, remaining memory cells except for the selected memory cell may be referred to as a non-selected memory cell and a word line connected to the non-selected memory cell may be referred to as a non-selected word line. Therefore, the selected word line and the non-selected word line in the program operation, the read operation and the erase operation may be driven by the internal voltage V_INN.

For example, in the program operation, the word line driving circuit 2200 may apply a program voltage of the internal voltages V_INN to the selected word line among the word lines WL1~WLn. The word line driving circuit 2200 may apply a program pass voltage, which may have a voltage level lower than the voltage level of the program voltage, to the non-selected word line. In the read operation, the word line driving circuit 2200 may apply a read voltage to the selected word line. The word line driving circuit 2200 may apply read pass voltage, which may have a voltage level higher than a voltage level of the read voltage, to the non-selected word line. In the erase operation, the word line driving circuit 2200 may apply a ground voltage to the selected word line.

The program operation may accompany a verification operation. The verification operation may verify whether the program operation with respect to the memory cell may be normally operated or not. However, the verification operation might not be restricted within the program operation.

The verification operation may include a sensing operation with respect to the memory cell similarly to the read operation. Thus, in the verification operation, the word line driving circuit 2200 may apply a verification voltage of the internal voltages V_INN to the selected word line and a verification pass voltage, which may have a voltage level higher than a voltage level of the verification voltage, to the non-selected word line.

The page buffer circuits 2300 may be connected with the memory cell array circuit 1000 through the bit lines BL1~BLm. The page buffer circuits 2300 may transmit data to the bit lines BL1~BLm in the program operation. The page buffer circuits 2300 may receive the data from the bit lines BL1~BLm in the read operation. Each of the page buffer circuits 2300 may include a plurality of latch circuits. Each of the latch circuits may perform circuit operations in accordance with the program operation and the read operation with respect to the data input/output based on an operation control signal CTR_OP generated from the operation control circuit 3000.

In various embodiments, numbers of the latch circuits may be changed in accordance with designs. Particularly, the numbers of the latch circuits may be changed in accordance with numbers of the data distributions stored in the memory cell. The memory cell of the non-volatile memory device may be defined as a single level cell, a multi-level cell, a triple level cell and a quadruple level cell in accordance with the numbers of the data distributions stored in one memory cell by the program operation. The single level cell may store two logic data corresponding 1 bit. The logic 'high' data and the logic 'low' data may correspond to the logic data. The multi-level cell may store four logic data corresponding to 2 bits. The triple level cell may store eight logic data corresponding to 3 bits. The quadruple level cell may store sixteen logic data corresponding to 4 bits. Thus, the numbers of the latch circuits may correspond to the numbers of the data distributions stored in the memory cell.

The column decoding circuit 2400 may be configured to control transmission paths of the input/output data. The column decoding circuit 2400 may receive data output from the page buffer circuits 2300. The column decoding circuit 2400 may receive data input from the data input/output circuit 2500. The column decoding circuit 2400 may receive a selection address signal ADD_S from the operation control circuit 3000 to control the transmission paths of the input/output data. The selection address signal ADD_S may be used for selecting the transmission path corresponding to a corresponding bit line among the bit lines BL1~BLm.

The data input/output circuit 2500 may be configured to control the input/output of an internal data signal DAT_INN and an external data signal DAT_EXT. The internal data signal DAT_INN may include data input/output inside the semiconductor memory device. The external data signal DAT_EXT may include data input/output outside the semiconductor memory device. The data input/output circuit 2500 may perform a data input/output operation based on an input/output control signal CTR_IO generated from the operation control circuit 3000. The data input/output circuit 2500 may output the external data signal DAT_EXT as the internal data signal DAT_INN input through the host device or the control device in the program operation based on the input/output control signal CTR_IO. The data input/output circuit 2500 may output the internal data signal DAT_INN as the external data DAT_EXT input from the column decoding circuit 2400 in the read operation based on the input/output control signal CTR_IO.

The operation control circuit 3000 may be configured to control the voltage generation circuit 2100, the word line driving circuit 2200, the page buffer circuits 2300, the column decoding circuit 2400 and the data input/output circuit 2500 in the driving circuit 2000. The operation control circuit 3000 may generate a voltage control signal CTR_V for controlling the voltage generation circuit 2100 based on a command signal CMD and an address signal ADD input through the host device or the control device. The operation control circuit 3000 may generate the drive address signal ADD_D for controlling the word line driving circuit 2200, the operation control signal CTR_OP for controlling the page buffer circuits 2300, the selection address signal ADD_S for controlling the column decoding circuit 2400 and the input/output control signal CTR_IO for controlling the data input/output circuit 2500. Thus, the operation control circuit 300 may generate the various control signals to control the semiconductor memory device.

Figure 2:
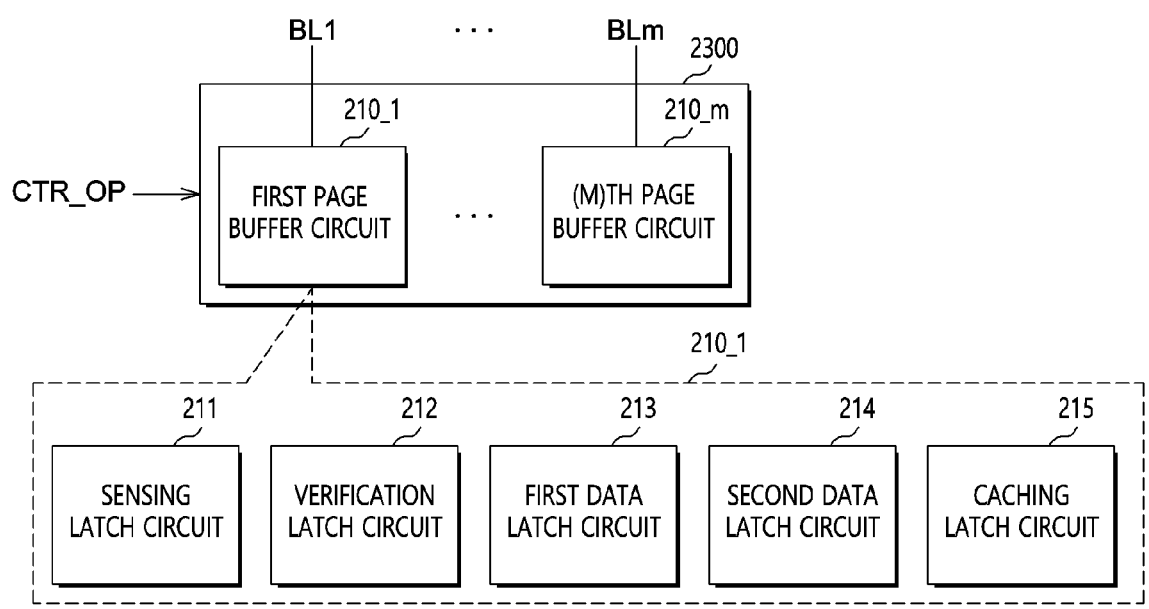
FIG. 2 is a block diagram illustrating an example of a plurality of page buffer circuits in FIG. 1.

FIG. 2 is a block diagram illustrating an example of a plurality of page buffer circuits in FIG. 1.

Referring to FIGS. 1 and 2, the page buffer circuits 2300 may be configured to store input/output data in accordance with the program operation and the read operation based on the operation control signal CTR_OP.

The page buffer circuits 2300 may include first to (m)th page buffer circuits 210_1~210_m connected to each of the bit lines BL1~BLm. In various embodiments, the first page buffer circuit 210_1 among the first to (m)th page buffer circuits 210_1~210_m connected to the first bit line BL1 may be explained.

The first page buffer circuit 210_1 may be connected to the first bit line BL1 to store the input/output data into/from the first bit line BL1 in the program operation and the read operation. The first page buffer circuit 210_1 may include a sensing latch circuit 211, a verification latch circuit 212, a first data latch circuit 213, a second data latch circuit 214 and a caching latch circuit 215. The sensing latch circuit 211, the verification latch circuit 212, the first data latch circuit 213, the second data latch circuit 214 and the caching latch circuit 215 may perform various functions as well as the program operation and the read operation. Hereinafter, for conveniences of explanations, functions among the various functions may be illustrated.

The sensing latch circuit 211 may receive the data stored in the memory cell to sense and store the data. For example, the sensing latch circuit 211 may store previously stored data or inverted data in accordance with the data transmitted through the first bit line BL1 in the read operation and the verification operation. Further, the sensing latch circuit 211 may perform a setup operation with respect to the first bit line BL1.

The verification latch circuit 212 may be configured to store verification data corresponding to the data stored in the memory cell. For example, the verification latch circuit 212 may store the verification data corresponding to the data stored in the memory cell in the verification operation in accordance with a double verification program operation.

The first data latch circuit 213, the second data latch circuit 214 and the caching latch circuit 215 may be configured to store the data input/output into/from the memory cell. For example, the first data latch circuit 213, the second data latch circuit 214 and the caching latch circuit 215 may store the verification data corresponding to the data stored in the memory cell in the verification operation in accordance with the program operation.

Numbers of the first data latch circuit 213, the second data latch circuit 214 and the caching latch circuit 215 may be changed in accordance with designs. For example, the numbers of the first data latch circuit 213, the second data latch circuit 214 and the caching latch circuit 215 may correspond to the numbers of the data distribution stored in the memory cell. That is, the numbers of the first data latch circuit 213, the second data latch circuit 214 and the caching latch circuit 215 may correspond to the triple level cell. In this case, the first data latch circuit 213 may store the verification data corresponding to a most significant bit (MSB). The second data latch circuit 214 may store the verification data corresponding to a central significant bit (CSB). The caching latch circuit 215 may store the verification data corresponding to a least significant bit (LSB).

Additionally, the caching latch circuit 215 may store and output the data to be finally output in the read operation. The read operation may be substantially similar to an output operation with respect to suspend data as a result value of the suspend operation. Thus, the caching latch circuit 215 may finally store and output the suspend data corresponding to the suspend operation.

Figure 3:
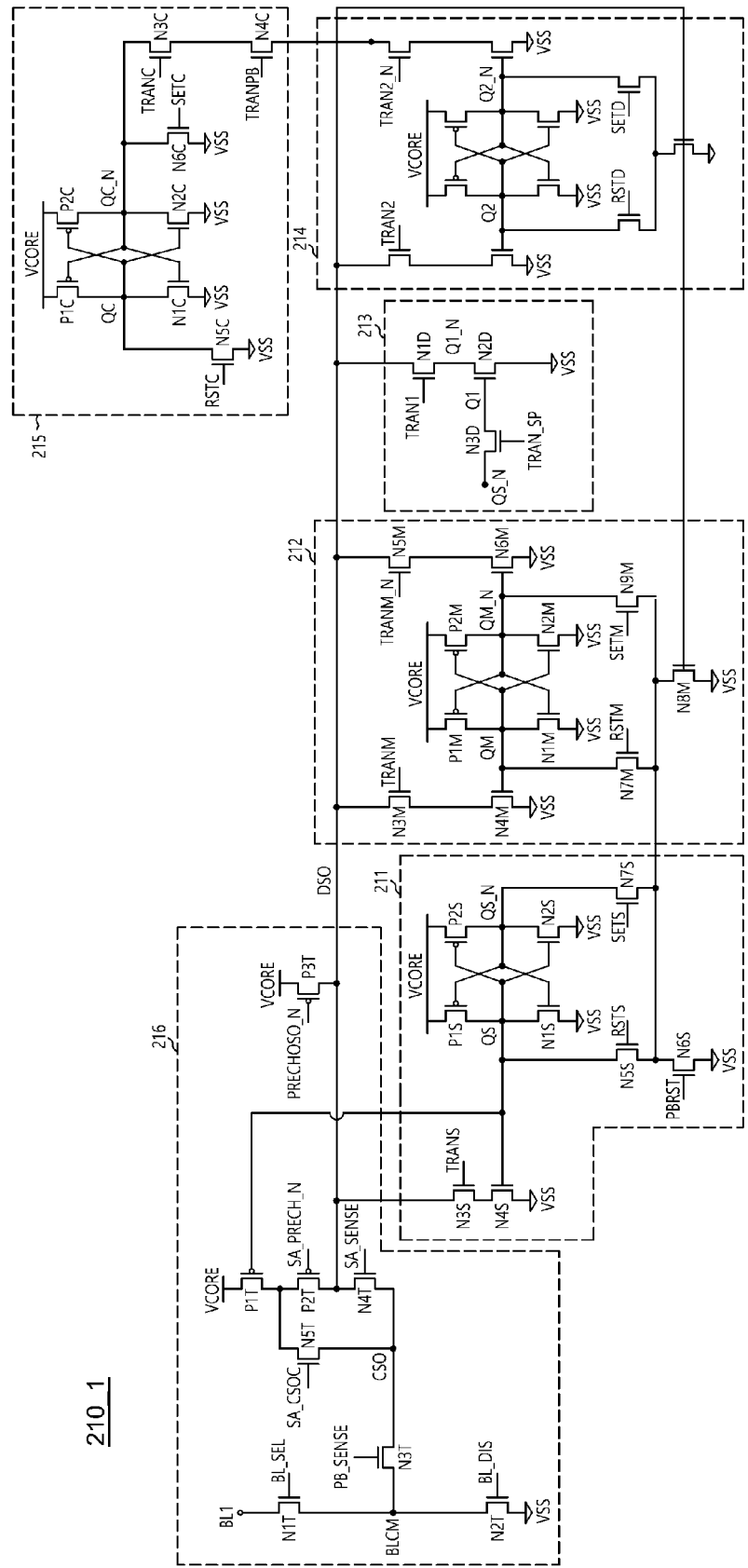
FIG. 3 is a circuit diagram illustrating an example of first page buffer circuits in FIG. 2.

FIG. 3 is a circuit diagram illustrating an example of a first page buffer circuit in FIG. 2. The first page buffer circuit 210_1 may be controlled based on the operation control signal CTR_OP generated from the operation control circuit 3000 in FIG. 1. Thus, the operation control signal CTR_OP may include various control signals for controlling the first page buffer circuit 210_1.

Referring to FIG. 3, the first page buffer circuit 210_1 may include the sensing latch circuit 211, the verification latch circuit 212, the first data latch circuit 213, the second data latch circuit 214, the caching latch circuit 215 and a data transmission circuit 216.

The sensing latch circuit 211 may sense and store the data transmitted through the first bit line BL1 in the sensing operation of the memory cell. The sensing latch circuit 211 may include a static type latch circuit. The sensing latch circuit 211 may include first and second PMOS transistors P1S and P2S and first to seventh NMOS transistors N1S~N7S.

Particularly, the sensing latch circuit 211 may include the first PMOS transistor P1S and the first NMOS transistor N1S serially connected between a core power voltage terminal VCORE and a ground power voltage terminal VSS. The sensing latch circuit 211 may include the second PMOS transistor P2S and the second NMOS transistor N2S serially connected between the core power voltage terminal VCORE and the ground power voltage terminal VSS. A gate of the first PMOS transistor P1S and a gate of the first NMOS transistor N1S may be commonly connected to a negative sensing data node QS_N commonly connected to the second PMOS transistor P2S and the second NMOS transistor N2S. A gate of the second PMOS transistor P2S and a gate of the second NMOS transistor N2S may be commonly connected to a positive sensing data node QS commonly connected to the first PMOS transistor P1S and the first NMOS transistor N1S.

Therefore, the sensing latch circuit 211 may have the above-mentioned structure to store the data transmitted to the positive sensing data node QS and the negative sensing data node QS_N.

The sensing latch circuit 211 may include the third NMOS transistor N3S and the fourth NMOS transistor N4S serially connected between a data sensing node DSO and the ground power voltage terminal VSS. A gate of the third NMOS transistor N3S may receive a sensing transmission signal TRANS. A gate of the fourth NMOS transistor N4S may be connected to the positive sensing data node QS. The sensing latch circuit 211 may include the fifth NMOS transistor N5S and the sixth NMOS transistor N6S serially connected between the positive sensing data node QS and the ground power voltage terminal VSS. A gate of the fifth NMOS transistor N5S may receive a sensing reset signal RSTS. A gate of the sixth NMOS transistor N6S may receive a page reset signal PBRST. The sensing latch circuit 211 may include the seventh NMOS transistor N7S connected between the negative sensing data node QS_N and the sixth NMOS transistor N6S. A gate of the seventh NMOS transistor N7S may receive a sensing set signal SETS. The sensing latch circuit 211 may share an eighth NMOS transistor N8M of the verification latch circuit 212.

Thus, the sensing latch circuit 211 may perform an initiation operation and a data input/output operation with respect to the sensing latch circuit 211 based on the sensing transmission signal TRANS, the page reset signal PBRST, the sensing reset signal RSTS and the sensing set signal SETS.

The verification latch circuit 212 may store the verification data in the verification operation. The verification latch circuit 212 may include a static type latch circuit. The verification latch circuit 212 may include first and second PMOS transistors P1M and P2M and first to ninth NMOS transistors N1M~N9M.

Particularly, the verification latch circuit 212 may include the first PMOS transistor P1M and the first NMOS transistor N1M serially connected between the core power voltage terminal VCORE and the ground power voltage terminal VSS. The verification latch circuit 212 may include the second PMOS transistor P2M and the second NMOS transistor N2M serially connected between the core power voltage terminal VCORE and the ground power voltage terminal VSS. A gate of the first PMOS transistor P1M and a gate of the first NMOS transistor N1M may be commonly connected to a negative verification data node QM_N. A gate of the second PMOS transistor P2M and a gate of the second NMOS transistor N2M may be commonly connected to a positive verification data node QM.

Therefore, the verification latch circuit 212 may have the above-mentioned structure to store the data transmitted to the positive verification data node QM and the negative verification data node QM_N.

The verification latch circuit 212 may include the third NMOS transistor N3M and the fourth NMOS transistor N4M serially connected between the data sensing node DSO and the ground power voltage terminal VSS. A gate of the third NMOS transistor N3M may receive a positive verification transmission signal TRANM. A gate of the fourth NMOS transistor N4M may be connected to the positive verification data node QM. The verification latch circuit 212 may include the fifth NMOS transistor N5M and the sixth NMOS transistor N6M serially connected between the data sensing node DSO and the ground power voltage terminal VSS. A gate of the fifth NMOS transistor N5M may receive a negative verification transmission signal TRANM_N. A gate of the sixth NMOS transistor N6M may be connected to the negative verification data node QM_N. The verification latch circuit 212 may include the seventh NMOS transistor N7M and the eighth NMOS transistor N8M serially connected between the positive verification data node QM and the ground power voltage terminal VSS. A gate of the seventh NMOS transistor N7M may receive a verification reset signal RSTM. A gate of the eighth NMOS transistor N8M may be connected to the data sensing node DSO. The ninth NMOS transistor N9M may be connected between the negative verification data node QM_N and the eighth NMOS transistor N8M. A gate of the ninth NMOS transistor N9M may receive a verification set signal SETM.

Thus, the verification latch circuit 212 may perform an initiation operation and a data input/output operation with respect to the verification latch circuit 212 based on the positive and negative verification transmission signals TRANM and TRANM_N, the verification reset signal RSTM and the verification set signal SETM.

The first data latch circuit 213, the second data latch circuit 214 and the caching latch circuit 215 may be configured to store data corresponding to the normal operation. The normal operation may include the program operation, the read operation, etc.

The first data latch circuit 213 may include a dynamic type latch circuit. The dynamic type latch circuit may occupy an area smaller than an area occupied by the static type latch circuit. As shown in FIG. 3, the first data latch circuit 213 corresponding to the dynamic type latch circuit may include less transistors than the verification latch circuit 212 corresponding to the static type latch circuit. That is, a circuit area of the first data latch circuit 213 may be smaller than a circuit area of the verification latch circuit 212. Thus, in an embodiment, the first page buffer circuit 210_1 may use the dynamic type latch circuit having the small area to stably perform the suspend operation.

The first data latch circuit 213 may include first to third NMOS transistors N1D, N2D and N3D.

The first NMOS transistor N1D and the second NMOS transistor N2D may be serially connected between the data sensing node DSO and the ground power voltage terminal VSS. A gate of the first NMOS transistor N1D may receive a first data transmission signal TRAN1. A gate of the second NMOS transistor N2D may be connected to a first positive data node Q1. The third NMOS transistor N3D may be connected between the negative sensing data node QS_N and the first positive data node Q1. A gate of the third NMOS transistor N3D may receive a suspend transmission signal TRAN_SP. The suspend transmission signal TRAN_SP may be activated in the suspend operation to connect the negative sensing data node QS_N and the first positive data node Q1.

Although not depicted in drawings, a capacitor may be formed at the first positive data node Q1 by the second NMOS transistor N2D. A voltage level corresponding to the first positive data node Q1 may be formed at the first negative data node Q1_N. Thus, the first data latch circuit 213 may function as a storage circuit configured to store the data in the second NMOS transistor N2D. The first NMOS transistor N1D may function as a normal transmission circuit configured to transmit the data in the data sensing node DSO and the storage circuit in the normal operation. The third NMOS transistor N3D may function as a suspend transmission circuit configured to control the transmission of the data between the sensing latch circuit 211 and the storage circuit in the suspend operation.

Therefore, the first data latch circuit 213 may have the above-mentioned structure to perform a data input/output operation with respect to the first data latch circuit 213 based on the first data transmission signal TRAN1 and the suspend transmission signal TRAN_SP.

The first page buffer circuit 210_1 may include the dynamic type first data latch circuit 213 having the relatively small area. The first page buffer circuit 210_1 may transmit the data through the first data latch circuit 213 in the suspend operation.

In an entering operation in accordance with the suspend operation, the first data latch circuit 213 may transmit the data in the first data latch circuit 213 to the sensing latch circuit 211. Thus, in an embodiment, the data in the first data latch circuit 213 may be preserved in the sensing latch circuit 211 without loss of the data. The first data latch circuit 213 may receive the data from the sensing latch circuit 211 in the sensing operation in accordance with the suspend operation. Thus, the first data latch circuit 213 may again store the previously stored data. The first data latch circuit 213 may again transmit the data in the first data latch circuit 213 to the sensing latch circuit 211 in a data output operation in accordance with the suspend operation after the sensing operation in accordance with the suspend operation. Thus, in an embodiment, the data in the first data latch circuit 213 may be preserved in the sensing latch circuit 211 without loss of the data. The first data latch circuit 213 may receive the data from the sensing latch circuit 211 in the resume operation in accordance with the suspend operation. Thus, the first data latch circuit 213 may again store the previously stored data to perform the normal operation stopped by the suspend operation.

The second data latch circuit 214 may have configurations substantially similar to the configurations of the verification latch circuit 212. Thus, any further illustrations with respect to the second data latch circuit 214 may be omitted herein for brevity. The second data latch circuit 214 may receive second positive and negative data transmission signals TRAN2 and TRAN2_N, a data reset signal RSTD and a data set signal SETD compared to the verification latch circuit 212. The second data latch circuit 214 may store the input/output data in second positive and negative data nodes Q2 and Q2_N.

Therefore, the second data latch circuit 214 may have the above-mentioned structure to perform an initiation operation and a data input/output operation with respect to the second data latch circuit 214 based on the second positive and negative data transmission signals TRAN2 and TRAN2_N, the data reset signal RSTD and the data set signal SETD.

The caching latch circuit 215 may store the data input/output into/from the first page buffer circuit 210_1. The caching latch circuit 215 may include first and second PMOS transistors P1C and P2C and first to sixth NMOS transistors N1C~N6C.

Particularly, the caching latch circuit 215 may include the first PMOS transistor P1C and the first NMOS transistor N1C serially connected between the core power voltage terminal VCORE and the ground power voltage terminal VSS. The caching latch circuit 215 may include the second PMOS transistor P2C and the second NMOS transistor N2C serially connected between the core power voltage terminal VCORE and the ground power voltage terminal VSS. A gate of the first PMOS transistor P1C and a gate of the first NMOS transistor N1C may be commonly connected to a negative caching data node QC_N. A gate of the second PMOS transistor P2C and a gate of the second NMOS transistor N2C may be commonly connected to a positive caching data node QC.

Therefore, the caching latch circuit 215 may have the above-mentioned structure to store the data transmitted to the positive caching data node QC and the negative caching data node QC_N.

The caching latch circuit 215 may include the third NMOS transistor N3C and the fourth NMOS transistor N4C serially connected between the negative caching data node QC_N and the data sensing node DSO. A gate of the third NMOS transistor N3C may receive a caching transmission signal TRANC. A gate of the fourth NMOS transistor N4C may receive a buffer transmission signal TRANPB. The fifth NMOS transistor N5C may be connected between the positive caching data node QC and the ground power voltage terminal VSS. A gate of the fifth NMOS transistor N5C may receive a caching reset signal RSTC. The sixth NMOS transistor N6C may be connected between the negative caching data node QC_N and the ground power voltage terminal VSS. A gate of the sixth NMOS transistor N6C may receive a caching set signal SETC.

Thus, the caching latch circuit 215 may perform an initiation operation and a data input/output operation with respect to the caching latch circuit 215 based on the caching transmission signal TRANC, the buffer transmission signal TRANPB, the sensing reset signal RSTC and the sensing set signal SETC. Further, the caching latch circuit 215 may receive the suspend data and finally output in the suspend operation.

The data transmission circuit 216 may store the data transmitted to a common sensing node CSO through the first bit line BL1 in the sensing operation. The data transmission circuit 216 may include first to fifth NMOS transistors N1T~N5T and first to third PMOS transistors P1T~P3T.

Particularly, the first NMOS transistor NIT and the second NMOS transistor N2T may be serially connected between the first bit line BL1 and the ground power voltage terminal VSS. A gate of the first NMOS transistor NIT may receive a bit line selection signal BL_DIS. The third NMOS transistor N3T may be connected between a bit line common node BLCM and the common sensing node CSO commonly connected to the first NMOS transistor N1T and the second NMOS transistor N2T. A gate of the third NMOS transistor N3T may receive a buffer sensing signal PB_SENSE. The first PMOS transistor P1T, the second PMOS transistor P2T and the fourth NMOS transistor N4T may be serially connected between the core power voltage terminal VCORE and the common sensing node CSO. A gate of the first PMOS transistor PIT may be connected to the positive sensing data node QS. A gate of the second PMOS transistor P2T may receive a pre-charge signal SA_PRECH_N. A gate of the fourth NMOS transistor N4T may receive a transmission control signal SA_SENSE. The fifth NMOS transistor N5T may be connected between the common sensing node CSO and a common node commonly connected to the first NMOS transistor NIT and the second NMOS transistor N2T. A gate of the fifth NMOS transistor N5T may receive a current control signal SA_CSOC. The third PMOS transistor P3T may be connected between the core power voltage terminal VCORE and the data sensing node DSO. A gate of the third PMOS transistor P3T may receive a common pre-charge signal PRECHOSO_N.

Therefore, the data transmission circuit 216 may have the above-mentioned structure to perform a pre-charging operation and a data transmission operation.

Figure 4:
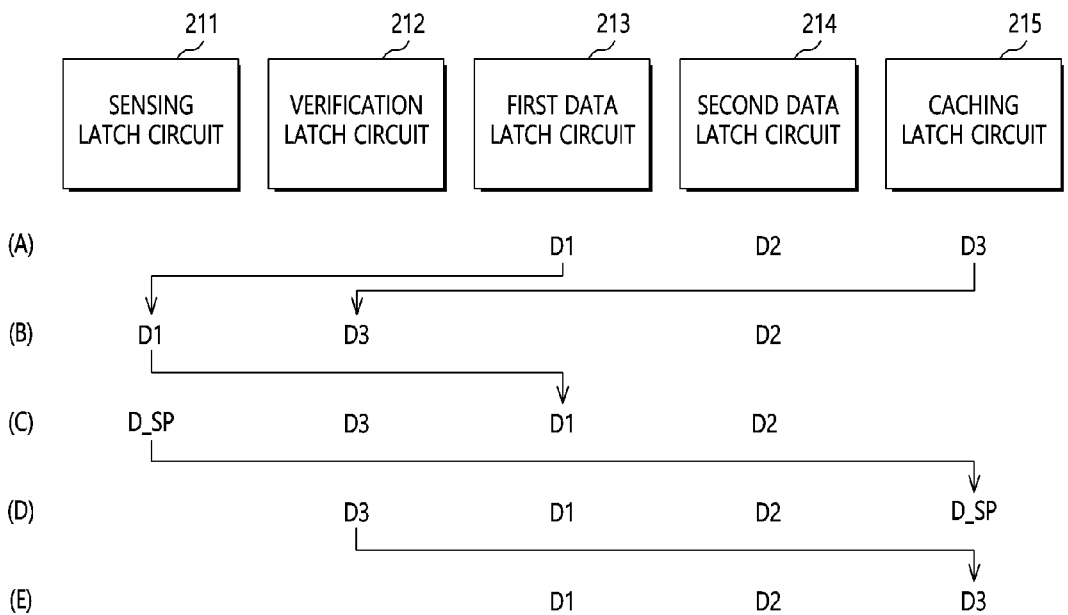
FIGS. 4 and 5 are views illustrating an example of a suspend operation of the first page buffer circuit in FIGS. 2 and 3.
Figure 5:
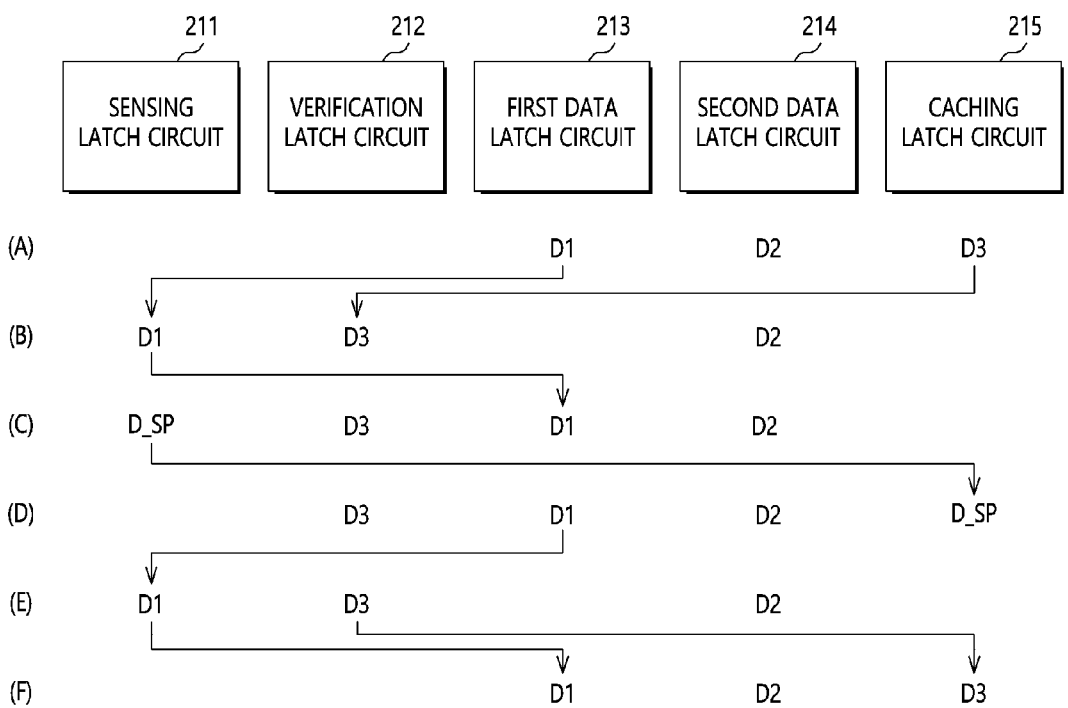

FIGS. 4 and 5 are views illustrating an example of a suspend operation of the first page buffer circuit in FIGS. 2 and 3. FIG. 4 may show the sensing latch circuit 211, the verification latch circuit 212, the first data latch circuit 213, the second data latch circuit 214 and the caching latch circuit 215. Further, FIG. 4 may show data transmission paths and data storage state of the sensing latch circuit 211, the verification latch circuit 212, the first data latch circuit 213, the second data latch circuit 214 and the caching latch circuit 215 in the suspend operation. Hereinafter, for conveniences of explanations, the program operation included in, for example, the normal operation may be illustrated.

Referring to FIG. 4, the memory cell may be programmed in the program operation A. The verification operation in accordance with the program operation A may be performed. As mentioned above, the first data latch circuit 213 may store first data D1 corresponding to the MSB in the verification operation in accordance with the program operation A. The second data latch circuit 214 may store second data D2 corresponding to the CSB. The caching latch circuit 215 may store third data D3 corresponding to the LSB.

The host device or the control device may request the suspend operation during the program operation A. The caching latch circuit 215 may transmit the third data D3 in the caching latch circuit 215 to the verification latch circuit 212 in the entering operation B in accordance with the suspend operation. Thus, the verification latch circuit 212 may receive and store the third data D3. The first data latch circuit 213 may transmit the first data D1 in the first data latch circuit 213 to the sensing latch circuit 211 in the entering operation B in accordance with the suspend operation. Thus, the sensing latch circuit 211 may receive and store the first data D1 stored in the first data latch circuit 213 in the entering operation B in accordance with the suspend operation.

As mentioned above, because the first data latch circuit 213 may include the dynamic type latch circuit, the first data D1 may be lost after a predetermined time. However, according to various embodiments, the first page buffer circuit 210_1 may transmit the first data D1 in the dynamic type first data latch circuit 213 to the sensing latch circuit 211 in the entering operation B in accordance with the suspend operation so that the first data D1 may be stored in the sensing latch circuit 211 without the loss of the first data D1.

The sensing latch circuit 211 may transmit the first data D1 in the sensing latch circuit 211 to the first data latch circuit 213 in the sensing operation C in accordance with the suspend operation. Thus, the first data latch circuit 213 may receive and store the first data D1 in the sensing operation C in accordance with the suspend operation. Thus, the sensing latch circuit 211 may sense and store the suspend data D_SP stored in the memory cell. The suspend data D_SP in the sensing latch circuit 211 may be output to the caching latch circuit 215.

The caching latch circuit 215 may receive, store and output the suspend data D_SP from the sensing latch circuit 211 in the output operation D in accordance with the suspend operation. That is, the caching latch circuit 215 may finally output the suspend data D_SP corresponding to the suspend operation.

The verification latch circuit 212 may transmit the third data D3 in the verification latch circuit 212 to the caching latch circuit 215 in the resume operation E in accordance with the suspend operation. Thus, the caching latch circuit 214 may receive and store the third data D3. As shown in drawings, the storage state of the first to third data D1, D2 and D3 in the first data latch circuit 213, the second data latch circuit 215 and the caching latch circuit 214 in the resume operation E may be substantially the same as the storage state of the first to third data D1, D2 and D3 in the first data latch circuit 213, the second data latch circuit 215 and the caching latch circuit 215 in the program operation A. Thus, in an embodiment, the first page buffer circuit 210_1 including the first data latch circuit 213, the second data latch circuit 214 and the caching latch circuit 215 may immediately perform the previously performed program operation A by the resume operation E in accordance with the suspend operation.

According to various embodiments, the first page buffer circuit 210_1 may perform the sensing operation and the output operation with respect to the suspend data D_SP in the suspend operation requested in the normal operation.

The first page buffer circuit 210_1 may perform the previously performed normal operation by the resume operation.

Additionally, when the output operation D in accordance with the suspend operation may be longer than a set time, the first data D1 stored in the first data latch circuit 213 may be lost. Thus, although not depicted in drawings, the first data latch circuit 213 may transmit the first data D1 in the first data latch circuit 213 to the sensing latch circuit 211 in the output operation D in accordance with the suspend operation. The first data latch circuit 213 may receive and store the first data D1 from the sensing latch circuit 211 in the resume operation E in accordance with the suspend operation.

FIG. 5 may show the program operation A, the entering operation B in accordance with the suspend operation, the sensing operation C in accordance with the suspend operation, the output operation D in accordance with the suspend operation, a standby operation in accordance with the suspend operation and the resume operation F in accordance with the suspend operation. The standby operation E in accordance with the suspend operation may be further depicted in FIG. 5 compared to FIG. 4. Hereinafter, for conveniences of explanations, the standby operation E in, for example, accordance with the suspend operation may be illustrated.

Referring to FIG. 5, after performing the program operation A, the entering operation B in accordance with the suspend operation, the sensing operation C in accordance with the suspend operation and the output operation D in accordance with the suspend operation, the host device or the control device may again request the suspend operation. That is, the host device or the control device may again request the sensing operation and the output operation with respect to the suspend data D_SP. Hereinafter, for conveniences of explanations, an operation including the sensing operation and the output operation with respect to the continuously requested suspended operation may be referred to as the standby operation.

The first data latch circuit 213 may transmit the first data D1 in the first data latch circuit 213 to the sensing latch circuit 211 in the standby operation E in accordance with the suspend operation. Thus, the sensing latch circuit 211 may receive and store the first data D1 in the standby operation in accordance with the suspend operation. As shown in drawings, the storage state of the first to third data D1, D2 and D3 in the first data latch circuit 213, the second data latch circuit 214 and the caching latch circuit 215 in the standby operation E may be substantially the same as the storage state of the first to third data D1, D2 and D3 in the first data latch circuit 213, the second data latch circuit 214 and the caching latch circuit 215 in the entering operation B in accordance with the suspend operation. Thus, in an embodiment, the first page buffer circuit 210_1 may stably perform the sensing operation C and the output operation D in accordance with the suspend operation after the standby operation E in accordance with the suspend operation.

The sensing latch circuit 211 may transmit the first data D1 in the sensing latch circuit 211 to the first data latch circuit 213 in the resume operation F in accordance with the suspend operation. The verification latch circuit 212 may transmit the third data D3 in the verification latch circuit 212 to the caching latch circuit 215. Thus, the first page buffer circuit 210_1 including the first data latch circuit 213, the second data latch circuit 214 and the caching latch circuit 215 may immediately perform the previously performed program operation A by the resume operation F in accordance with the suspend operation.

According to various embodiments, the first page buffer circuit 210_1 may perform the continuously requested suspend operation by the standby operation in accordance with the suspend operation.

Figure 6:
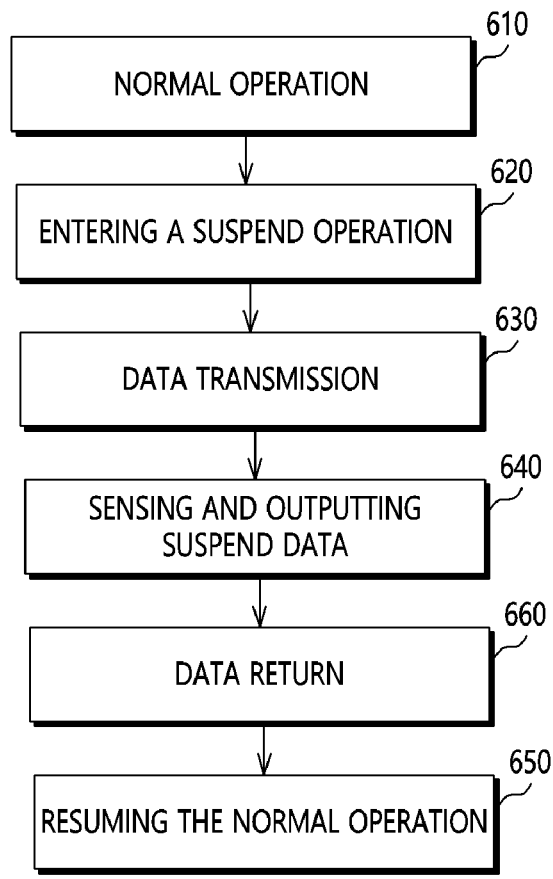
FIG. 6 is a flow chart illustrating an example of a method of operating the semiconductor memory device in FIG. 1.

FIG. 6 is a flow chart illustrating an example of a method of operating the semiconductor memory device in FIG. 1.

Referring to FIGS. 1, 2, 4 and 6, the operating method 600 may include a normal operation step 610, a suspend operation entering step 620, a data transmission step 630, a suspend data sensing and outputting step 640 and a normal operation resuming step 650.

In the normal operation step 610, the semiconductor memory device including the static type sensing latch circuit 211 and the dynamic type first data latch circuit 213 may perform the normal operation. The normal operation step 610 may include the program operation, the read operation, etc.

In the suspend operation entering step 620, the semiconductor memory device may enter into the suspend operation based on the command signal CMD corresponding to the suspend operation.

In the data transmission step 630, the data may be transmitted between the first data latch circuit 213 and the sensing latch circuit 211. The data transmission step 630 may include transmitting the first data D1 in the first data latch circuit 213 to the sensing latch circuit 211 in the entering operation B in accordance with the suspend operation in FIG. 4. The data transmission step 630 may include transmitting the first data D1 in the sensing latch circuit 211 to the first data latch circuit 213 in the sensing operation C in accordance with the suspend operation in FIG. 4. As mentioned above, the transmission of the first data D1 from the sensing latch circuit 211 to the first data latch circuit 213 may be performed before the sensing operation and the output operation.

In the suspend data sensing and outputting step 640, the suspend data D_SP may be sensed and output through the sensing latch circuit 211. The suspend data sensing outputting step 640 may include the output operation D in accordance with the suspend operation in FIG. 4.

In the normal operation resuming step 650, the normal operation step 610 performed before the suspend operation entering step 620 may be resumed. The normal operation resuming step 650 may include the resume operation E in FIG. 4.

According to various embodiments, the semiconductor memory device may stably sense and output the suspend data D_SP in accordance with the suspend operation using the dynamic type latch circuit.

Further, as mentioned above with reference to FIG. 5, the host device or the control device may continuously perform the suspend operation. When the suspend operation may be repeated, the data transmission step 630 may also be repeated. The data transmission step 630 may include the standby operation E and the resume operation F in FIG. 5. As shown in FIG. 5, the first data D1 in the first data latch circuit 213 may be transmitted to the sensing latch circuit 211 in the standby operation E. The first data D1 in the sensing latch circuit 211 may be transmitted to the first data latch circuit 213 in the resume operation F.

Therefore, in an embodiment, the semiconductor memory device may stably sense and output the suspend data D_SP corresponding to the continuously performed suspend operation.

Additionally, the operating method 600 may further include a data return step 660. In the data return step 660, the data in the verification latch circuit 212 in FIG. 2 may be returned to the caching latch circuit 215 before the normal operation resume step 650. The data return step 660 may include returning the third data D3 in the verification latch circuit 212 in FIG. 4 to the caching latch circuit 215.

According to various embodiments, the semiconductor memory device may stably perform the normal operation resume step 650 through the data return step 660 with respect to the caching latch circuit 215.

Figure 7:
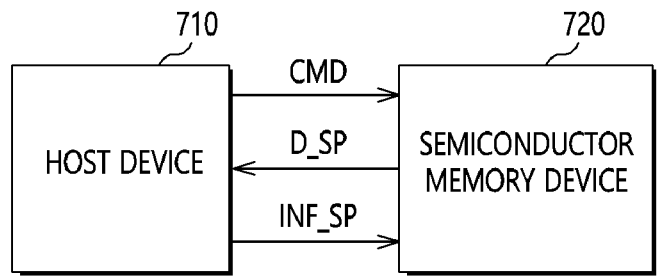
FIG. 7 is a block diagram illustrating a semiconductor memory system in accordance with various examples of embodiments.

FIG. 7 is a block diagram illustrating a semiconductor memory system in accordance with various examples of embodiments.

Referring to FIG. 7, a semiconductor memory system 700 may be used in a cellular phone, a smart phone, an MP3 player, a laptop computer, a desktop computer, a game device, a TV, a tablet PC, an in-vehicle infotainment system, etc. The semiconductor memory system 700 may include a host device 710 and a semiconductor memory device 720.

The host device 710 may be configured to control the semiconductor memory device 720. The host device 710 may control the semiconductor memory device 720 based on the command signal CMD. The command signal CMD may correspond to the suspend operation. The host device 710 may receive the suspend data D_SP from the semiconductor memory device 720 based on the command signal CMD corresponding to the suspend operation.

The semiconductor memory device 720 may output the suspend data D_SP based on the command signal CMD. The suspend operation of the semiconductor memory device 720 may be illustrated with reference to FIGS. 1 to 6. Thus, any further illustrations with respect to the suspend operation may be omitted herein for brevity.

The host device 710 may provide the semiconductor memory device 720 with suspend information INF_SP. The suspend information INF_SP may include numbers of the continuously performed suspend operation. That is, when the suspend operation is continuously performed, the host device 710 may provide the semiconductor memory device 720 with the performed numbers of the suspend operation as the suspend information INF_SP. The semiconductor memory device 720 may maintain in the standby operation E in FIG. 5 until a second suspend operation is performed after a first suspend operation. Particularly, the semiconductor memory device 720 may maintain the first data D1 in the sensing latch circuit 211 until the sensing operation in accordance with the second suspend operation is performed.

According to various embodiments, the semiconductor memory system 700 may control the suspend operation E with respect to the sensing latch circuit 211 in accordance with the numbers of the continuously performed suspend operation. Thus, in an embodiment, the semiconductor memory system 700 may minimize the data transmission operation.

The above described embodiments are intended to illustrate and not to limit the detailed description. Various alternatives and equivalents are possible. The embodiments are not limited by the embodiments described herein. Nor are the embodiments limited to any specific type of semiconductor device.

What is claimed is:

1. A page buffer circuit comprising:
    a data latch circuit configured to store first data corresponding to a normal operation; and
    a sensing latch circuit configured to store the first data transmitted from the data latch circuit in an entering operation during a suspend operation and to sense data stored in a memory cell after transmission of the first data stored in the sensing latch circuit to the data latch circuit in a sensing operation during the suspend operation.

2. The page buffer circuit of claim 1, wherein the sensing latch circuit performs a sensing operation with respect to the memory cell in the normal operation.

3. The page buffer circuit of claim 1, wherein the data latch circuit comprises a dynamic type latch circuit.

4. The page buffer circuit of claim 1, wherein the data latch circuit comprises:
    a storage circuit configured to store the first data; and
    a suspend transmission circuit configured to control data transmissions between the sensing latch circuit and the storage circuit in the suspend operation.

5. The page buffer circuit of claim 4, further comprising a caching latch circuit configured to store and output sensed data transmitted from the sensing latch circuit in an output operation after the sensing operation during the suspend operation.

6. The page buffer circuit of claim 5, wherein the data latch circuit further comprises a normal transmission circuit configured to control data transmissions between a data sensing node, which is commonly connected to the caching latch circuit and the data latch circuit, and the storage circuit.

7. The page buffer circuit of claim 5, wherein the data latch circuit and the caching latch circuit store data corresponding to a verification operation in the verification operation in the normal operation.

8. The page buffer circuit of claim 5, further comprising a verification latch circuit configured to store second data transmitted from the caching latch circuit in the entering operation and to transmit the second data stored in the verification latch circuit to the caching latch circuit in a resume operation after the output operation during the suspend operation.

9. The page buffer circuit of claim 1, wherein the data latch circuit transmits the first data to the sensing latch circuit in an output operation during the suspend operation and the data latch circuit stores the first data transmitted from the sensing latch circuit in a resume operation after the output operation during the suspend operation.

10. The page buffer circuit of claim 1, wherein the data latch circuit transmits the first data to the sensing latch circuit in a standby operation during the suspend operation and the data latch circuit stores the first data transmitted from the sensing latch circuit in a resume operation after the standby operation during the suspend operation.

11. A method of operating a semiconductor memory device, the method comprising:
    performing, with the semiconductor memory device including a sensing latch circuit and a data latch circuit, a normal operation;
    transmitting first data from the data latch circuit to the sensing latch circuit in an entering operation during a suspend operation;
    sensing data stored in a memory cell through the sensing latch circuit after transmission of the first data from the sensing latch circuit to the data latch circuit in a sensing operation during the suspend operation; and
    outputting sensed data stored in the sensing latch circuit in an output operation during the suspend operation.

12. The method of claim 11, further comprising transmitting the first data from the data latch circuit to the sensing latch circuit in a standby operation after the output operation during the suspend operation.

13. The method of claim 11, further comprising:
transmitting second data from a caching latch circuit to a verification latch circuit in the entering operation; and
transmitting the sensed data from the sensing latch circuit to the caching latch circuit in the output operation.

14. The method of claim 13, further comprising returning the second data from the verification latch circuit to the caching latch circuit after the output operation before resuming the normal operation.

15. A semiconductor memory system comprising:
a semiconductor memory device including a data latch circuit and a sensing latch circuit, the data latch circuit configured to store first data corresponding to a normal operation and to transmit the first data to the sensing latch circuit in a suspend operation, and the sensing latch circuit configured to return the first data to the data latch circuit before sensing data stored in a memory cell in the suspend operation; and
a host device configured to control the suspend operation.

16. The semiconductor memory system of claim 15, wherein the host device transmits suspend information corresponding to number of suspend operations to be consecutively performed in the semiconductor memory device; and
wherein the semiconductor memory device maintains the first data in the sensing latch circuit until a sensing operation during the suspend operation is performed based on the suspend information.

17. The semiconductor memory system of claim 15, wherein the semiconductor memory device further comprises a caching latch circuit and a verification latch circuit, the caching latch circuit configured to perform an output operation to the host device, and
wherein the semiconductor memory device transmits second data stored in the caching latch circuit to the verification latch circuit before transmission of sensed data from the sensing latch circuit to the caching latch circuit and returns the second data stored in the verification latch circuit to the caching latch circuit after outputting the sensed data from the caching latch circuit to the host device, in the suspend operation.

\* \* \* \* \*